(12) United States Patent
Saxler

(10) Patent No.: US 7,112,860 B2
(45) Date of Patent: Sep. 26, 2006

(54) INTEGRATED NITRIDE-BASED ACOUSTIC WAVE DEVICES AND METHODS OF FABRICATING INTEGRATED NITRIDE-BASED ACOUSTIC WAVE DEVICES

(75) Inventor: Adam William Saxler, Durham, NC (US)

(73) Assignee: Cree, Inc., Durham, NC (US)

( * ) Notice: Subject to any disclaimer, the term of this patent is extended or adjusted under 35 U.S.C. 154(b) by 262 days.

(21) Appl. No.: 10/378,331

(22) Filed: Mar. 3, 2003

(65) Prior Publication Data

US 2004/0173816 A1 Sep. 9, 2004

(51) Int. Cl.
*H01L 29/84* (2006.01)
*H01L 41/08* (2006.01)

(52) U.S. Cl. ...................... 257/416; 310/322
(58) Field of Classification Search ................ 257/184, 257/195, 415, 416, 458, 53, 76; 438/50, 438/481; 310/317, 318, 322
See application file for complete search history.

(56) References Cited

U.S. PATENT DOCUMENTS

| | | | | |
|---|---|---|---|---|
| 3,955,160 | A * | 5/1976 | Duffy ........................ 333/150 |
| 4,912,063 | A | 3/1990 | Davis et al. ................ 437/100 |
| 4,912,064 | A | 3/1990 | Kong et al. ................ 437/100 |
| 4,946,547 | A | 8/1990 | Palmour et al. ............ 156/643 |
| 5,011,549 | A | 4/1991 | Kong et al. ................ 148/33.1 |
| 5,155,062 | A | 10/1992 | Coleman .................... 437/100 |
| 5,200,022 | A | 4/1993 | Kong et al. ................ 156/612 |
| 5,210,051 | A | 5/1993 | Carter, Jr. .................. 437/107 |
| 5,265,267 | A * | 11/1993 | Martin et al. .............. 455/326 |
| 5,270,554 | A * | 12/1993 | Palmour .................... 257/77 |
| 5,292,501 | A | 3/1994 | Degenhardt et al. ........ 424/49 |
| RE34,861 | E | 2/1995 | Davis et al. ................ 437/100 |
| 5,393,993 | A | 2/1995 | Edmond et al. ............ 257/77 |
| 5,523,589 | A | 6/1996 | Edmond et al. ............ 257/77 |
| 5,576,589 | A * | 11/1996 | Dreifus et al. ............ 310/313 A |
| 5,592,501 | A | 1/1997 | Edmond et al. ............ 372/45 |
| 5,739,554 | A | 4/1998 | Edmond et al. ............ 257/103 |
| 6,063,186 | A | 5/2000 | Irvine et al. ................ 117/89 |
| 6,217,662 | B1 | 4/2001 | Kong et al. ................ 118/725 |
| 6,218,680 | B1 | 4/2001 | Carter, Jr. et al. .......... 257/77 |

(Continued)

FOREIGN PATENT DOCUMENTS

EP 0373 606 12/1989

(Continued)

OTHER PUBLICATIONS

Ng, K.N., "Interdigital Transducer", *Complete Guide to Semiconductor Devices*, Ch. 66 (2000) pp. 511-516.

(Continued)

*Primary Examiner*—Laura M. Schillinger
*Assistant Examiner*—Jennifer M Dolan
(74) *Attorney, Agent, or Firm*—Myers Bigel Sibley & Sajovec, P.A.

(57) ABSTRACT

A monolithic electronic device includes a substrate, a semi-insulating, piezoelectric Group III-nitride epitaxial layer formed on the substrate, a pair of input and output interdigital transducers forming a surface acoustic wave device on the epitaxial layer and at least one electronic device (such as a HEMT, MESFET, JFET, MOSFET, photodiode, LED or the like) formed on the substrate. Isolation means are disclosed to electrically and acoustically isolate the electronic device from the SAW device and vice versa. In some embodiments, a trench is formed between the SAW device and the electronic device. Ion implantation is also disclosed to form a semi-insulating Group III-nitride epitaxial layer on which the SAW device may be fabricated. Absorbing and/or reflecting elements adjacent the interdigital transducers reduce unwanted reflections that may interfere with the operation of the SAW device.

24 Claims, 6 Drawing Sheets

U.S. PATENT DOCUMENTS

| | | | |
|---|---|---|---|
| 6,265,727 B1 | 7/2001 | Kozodoy et al. | 257/21 |
| 6,285,866 B1* | 9/2001 | Lee et al. | 455/318 |
| 6,297,522 B1 | 10/2001 | Kordina et al. | 257/77 |
| 6,300,706 B1* | 10/2001 | Grudkowski et al. | 310/334 |
| 6,316,793 B1 | 11/2001 | Sheppard et al. | 257/103 |
| 6,396,080 B1 | 5/2002 | Carter, Jr. et al. | 257/77 |
| 6,403,982 B1 | 6/2002 | Carter, Jr. et al. | 257/77 |
| 6,495,852 B1 | 12/2002 | Mouri | 257/21 |
| 6,518,637 B1* | 2/2003 | Thompson et al. | 257/416 |
| 6,548,333 B1 | 4/2003 | Smith | 438/172 |
| 6,555,946 B1* | 4/2003 | Finder et al. | 310/324 |
| 6,686,616 B1 | 2/2004 | Allen et al. | 257/280 |
| 2001/0035695 A1* | 11/2001 | Kadota et al. | 310/313 R |
| 2002/0090454 A1 | 7/2002 | Paisley et al. | 427/248.1 |
| 2002/0113668 A1* | 8/2002 | Tanaka et al. | 333/195 |
| 2002/0158707 A1 | 10/2002 | Noguchi | 333/133 |
| 2002/0167023 A1 | 11/2002 | Chavarkar et al. | 257/194 |
| 2002/0170491 A1 | 11/2002 | Mueller | 117/108 |
| 2003/0022412 A1* | 1/2003 | Higgins et al. | 438/50 |
| 2003/0030119 A1* | 2/2003 | Higgins et al. | 257/428 |

FOREIGN PATENT DOCUMENTS

| | | |
|---|---|---|
| JP | 58197910 | 11/1983 |
| JP | 05183381 | 7/1993 |

OTHER PUBLICATIONS

Hagon et al. "Integrated Programmable Analog Matched Filters for Spread Spectrum Applications," IEEE Ultrasonics Symposium, 1973, pp. 333-335.

Stutzmann et al. "GaN-based heterostructures for sensor applications," *Diamond and Related Materials*, vol. 11, No. 3-6, Mar. 2002, pp. 886-891.

Takagaki et al. "Superhigh-frequency surface-wave transducers using AlN layers grown on SiC substrates," *Applied Physics Letters*, vol. 81, No. 14, Sep. 30, 2002, pp. 2538-2540.

Tsubouchi et al. "Zero Temperature Coefficient Saw Delay Line on AlN Epitaxial Films," IEEE Ultrasonics Symposium, Atlanta, GA, 1983, pp. 299-310.

Invitation to Pay Additional Fees issued Aug. 31, 2004 for corresponding PCT application No. PCT/US2004/006232.

International Search Report and Written Opinion for PCT US2004/006232; date of mailing Nov. 11, 2004.

U.S. Patent Application for *Induction Heating Devices and Methods for Controllably Heating an Article*, U.S. Appl. No. 10/017,492, filed Oct. 30, 2001.

U.S. Patent Application for *Gas Driven Planetary Rotation Apparatus and Methods for Forming Silicon Carbide Layer*, U.S. Appl. No. 10/117,858, filed Apr. 8, 2002.

U.S. Patent Application for *Susceptor Designs for Silicon Carbide Thin Films*, U.S. Appl. No. 09/715,576, filed Mar. 3, 2003.

Sheppard et al., "Improved 10-GHz Operation of GaN/AlGaN HEMTs on Silicon Carbide", *Materials Science Forum*, vols. 338-342 (2000) pp. 1643-1646.

Sheppard et al., "High Power Demonstration at 10 GHz with GaN/AlGaN HEMT Hybrid Amplifiers", *Presented at the 58th DRC*, Denver, CO (Jun. 2000) 20 pages.

* cited by examiner

INTEGRATED NITRIDE-BASED ACOUSTIC WAVE DEVICES AND METHODS OF FABRICATING INTEGRATED NITRIDE-BASED ACOUSTIC WAVE DEVICES

BACKGROUND

The present invention relates to nitride-based acoustic wave devices. Acoustic wave devices form a class of electronic devices that process signals that exist as acoustic (i.e. sound or compression) waves traveling in piezoelectric crystals. Piezoelectric crystals are characterized by the fact that when the material is mechanically stressed (i.e. compressed or placed under tension), an associated electric field is induced. Likewise, when an electric field is applied to a piezoelectric crystal, the material becomes mechanically stressed in a predetermined manner. It is possible to exploit these characteristics to perform many different functions with a piezoelectric crystal.

For example, piezoelectric microphones convert acoustic waves traveling though air into electronic signals. Piezoelectric speakers and buzzers perform the opposite function. Piezoelectric sensors detect changes in pressure, temperature, torque, humidity and/or a wide range of other phenomena.

Common piezoelectric materials include quartz ($SiO_2$), zinc oxide (ZnO), barium titanate ($BaTiO_3$), lithium tantalate ($LiTaO_3$) and lithium niobate ($LiNbO_3$). However, other materials, most notably silicon carbide (SiC) and the Group III-nitride materials such as aluminum nitride (AlN) and Gallium Nitride (GaN) are piezoelectric and may be used to form acoustic wave devices.

When a time-varying electric field is applied to a portion of a piezoelectric crystal, the applied electric field induces an acoustic wave that propagates through the crystal. Acoustic waves may travel through a piezoelectric material in a number of modes. For example, acoustic waves may travel through the body of the material—so-called "bulk" waves—or on the surface of the material. Waves that travel along the surface of the piezoelectric material are generally referred to as surface acoustic waves (or SAWs), and devices that process surface acoustic waves are referred to as surface acoustic wave devices, or SAW devices.

A simple surface acoustic wave device comprises a piezoelectric crystal or a thin film of piezoelectric material on a substrate. Interdigitated metal stripes on the surface of the crystal form transmitting and receiving electrodes. The metal electrodes convert electrical energy into mechanical stress in the crystal and vice versa. Hence, the interdigital electrodes formed on a piezoelectric material are referred to as interdigital transducers, or IDTs.

A simple surface acoustic wave device is illustrated in perspective in FIG. 10. The SAW device comprises a piezoelectric film 2 formed on a substrate 1. A metal (usually aluminum) is deposited on the film and patterned using standard photolithographic or liftoff techniques to form the input IDT 3 and the output IDT 4. The thickness of the piezoelectric film is generally on the order of one SAW wavelength.

In operation, an electric signal may be applied to the input IDT 3. The input signal causes a surface acoustic wave to be induced in the piezoelectric film 2 and propagate along the surface of the film 2 towards the output IDT 4. The shape of the generated wave depends on the electric signal applied to the input IDT, the design and orientation of the IDT fingers, and the piezoelectric material used. When the wave reaches the output IDT 4, a voltage is induced across the fingers of the IDT 4 which is then output from the device. The shape of the output wave is affected by the design of the output IDT 4.

FIG. 11 illustrates some design parameters for IDTs. The finger period D determines the wavelength λ of the SAW generated by the IDT. The linewidth L and space S of the fingers are generally equal to λ/4. The number of fingers determines the coupling efficiency of the IDT, and the width W of the overlap of fingers affects the frequency response of the finger pair. By changing the overlap of finger pairs within an IDT, various filter functions can be realized.

Surface acoustic wave devices have many different applications in digital and analog electronics. For example, surface acoustic wave devices may be used as bandpass or bandstop filters, duplexers, delay lines, resonators and/or impedance elements among other things. They may also be used to perform digital functions such as convolution, correlation, pulse compression and/or digital filtering (for example in spread-spectrum communication systems) depending on the design of the device, and in particular depending on the layout of the interdigital transducers. The design and fabrication of surface acoustic wave devices are described in Chapter 66 of K. Ng, *Complete Guide to Semiconductor Devices*, McGraw Hill (1995).

The velocity of surface acoustic waves in a device depends on the material from which the device is constructed and the mode of propagation of the SAW. For example, the propagation velocity (also called the SAW velocity) of first order Rayleigh-mode acoustic waves in GaN is around 3600 m/s, while the corresponding SAW velocity in AlN is about 5800 m/s, and over 6800 m/s in SiC. For RF devices, the SAW velocity determines the bandwidth of signals that can be processed by the device. The fundamental operating frequency ($f_0$) of a SAW device is given by the formula:

$$f_0 = \frac{v}{\lambda}$$

where v is the SAW velocity and λ is the wavelength. As discussed above, the wavelength of the device is determined by the finger period of the IDT. The width and spacing of IDT fingers (and thus the finger period) is limited by the resolution of photolithographic techniques. Thus, for a given finger period, increasing the SAW velocity increases the fundamental operating frequency of the device. Stated differently, having a higher SAW velocity permits a device to process higher-frequency signals for a given device geometry. Accordingly, the Group III-nitrides and SiC may be desirable piezoelectric materials for the fabrication of SAW devices.

Group III-nitrides and silicon carbide may also be desirable materials for the fabrication of high power, high temperature and/or high frequency devices. These wide bandgap materials have high electric field breakdown strengths and high electron saturation velocities as compared to other semiconductor materials such as gallium arsenide and silicon.

Electrical circuits requiring high power handling capability (>20 watts) while operating at high frequencies such as radio frequencies, including for example, S-band (2–4 GHz) and X-band (8–12 GHz), have in recent years become more prevalent. Because of the increase in high power, high frequency circuits there has been a corresponding increase in demand for transistors that are capable of reliably operating at radio frequencies and above while still being capable of handling higher power loads. Previously, bipolar transistors and power metal-oxide semiconductor field effect transistors (MOSFETs) have been used for high power applications but the power handling capability of such devices may be limited at higher operating frequencies. Junction field-effect transistors (JFETs) were commonly used for high frequency applications but the power handling capability of previously known JFETs may also be limited.

Recently, metal-semiconductor field effect transistors (MESFETs) have been developed for high frequency applications. The MESFET construction may be preferable for high frequency applications because only majority carriers carry current. The MESFET design may be preferred over current MOSFET designs because the reduced gate capacitance permits faster switching times of the gate input. Therefore, although all field-effect transistors utilize only majority carriers to carry current, the Schottky gate structure of the MESFET may make the MESFET more desirable for high frequency applications.

In addition to the type of structure, and perhaps more fundamentally, the characteristics of the semiconductor material from which a transistor is formed also affects the operating parameters. Of the characteristics that affect a transistor's operating parameters, the electron mobility, saturated electron drift velocity, electric breakdown field and thermal conductivity may have the greatest effect on a transistor's high frequency and high power characteristics.

Electron mobility is the measurement of how rapidly an electron is accelerated to its saturated velocity in the presence of an electric field. In the past, semiconductor materials which have a high electron mobility were preferred because more current could be developed with a lesser field, resulting in faster response times when a field is applied. Saturated electron drift velocity is the maximum velocity that an electron can obtain in the semiconductor material. Materials with higher saturated electron drift velocities are preferred for high frequency applications because the higher velocity may translate to shorter times from source to drain.

Electric breakdown field is the field strength at which breakdown of the Schottky junction and the current through the gate of the device suddenly increases. A high electric breakdown field material may be preferred for high power, high frequency transistors because larger electric fields generally can be supported by a given dimension of material. Larger electric fields may allow for faster transients as the electrons can be accelerated more quickly by larger electric fields than by smaller.

Thermal conductivity is the ability of the semiconductor material to dissipate heat. In typical operations, all transistors generate heat. In turn, high power and high frequency transistors usually generate larger amounts of heat than small signal transistors. As the temperature of the semiconductor material increases, the junction leakage currents generally increase and the current through the field effect transistor generally decreases due to a decrease in carrier mobility with an increase in temperature. Therefore, if the heat is dissipated from the semiconductor, the material may remain at a lower temperature and may be capable of carrying larger currents with lower leakage currents.

In the past, high frequency MESFETs have been manufactured of n-type III–V compounds, such as gallium arsenide (GaAs) because of their high electron mobilities. Although these devices provided increased operating frequencies and moderately increased power handling capability, the relatively low breakdown voltage and the lower thermal conductivity of these materials have limited their usefulness in high power applications.

Silicon carbide (SiC) has been known for many years to have excellent physical and electronic properties which should theoretically allow production of electronic devices that can operate at higher temperatures, higher power and higher frequency than devices produced from silicon (Si) or GaAs. The high electric breakdown field of about $4 \times 10^6$ V/cm, high saturated electron drift velocity of about $2.0 \times 10^7$ cm/sec and high thermal conductivity of about 4.9 W/cm-K indicate that SiC would be suitable for high frequency, high power applications.

SiC-based MESFET structures and their fabrication are described in U.S. Pat. No. 5,270,554 to Palmour et al. and U.S. Pat. No. 5,925,895 to Sriram et al., both of which are incorporated herein by reference as if fully set forth herein. SiC MESFET structures and fabrication are also described in U.S. application Ser. No. 09/567,717 filed May 10, 2000 by Allen, et al., the disclosure of which is incorporated herein by reference as if fully set forth herein.

In the nitride arena, a device of particular interest for high power and/or high frequency applications is the high electron mobility transistor (HEMT), which is also known as a heterostructure field effect transistor (HFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped, smaller bandgap material and can contain a very high sheet electron concentration in excess of, for example, $10^{13}$ carriers/cm$^2$. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity.

In electronic communication systems, it is usually desirable to amplify signals before transmission or after reception. It is also often desirable to filter such signals immediately before or after amplification. In high frequency communication systems, such amplification may be performed efficiently using an amplifier circuit incorporating a SiC MESFET or a Group III-nitride based transistor. Filtering may be efficiently performed using a SAW filter.

In order to minimize the number of circuit elements required to implement a communication system and simplify its design, it is desirable to integrate as many components as possible on a single chip. Attempts to integrate SAW devices with other devices have been made. However, such devices have typically required that the piezoelectric crystal be bonded onto a semiconductor substrate (such as silicon) on which active electronic components are formed.

SUMMARY OF THE INVENTION

Embodiments of the present invention provide a monolithic electronic device comprising a substrate, a piezoelectric Group III-nitride epitaxial layer formed on the substrate, a plurality of metal fingers formed on a semi-insulating region of the Group III-nitride epitaxial layer to define the input and output interdigital transducers of a surface acoustic wave device and at least one electronic device formed on the substrate. The electronic device comprises a metal contact that is electrically connected to at least one of the input and/or the output transducers.

The electronic device may comprise a HEMT, MESFET, JFET, MOSFET, photodiode, LED or other electronic device. In some embodiments, the piezoelectric Group III-nitride layer comprises $Al_xGa_{1-x}N$ ($0 \leq x \leq 1$) or $In_yAl_xGa_{1-x-y}N$ ($0 \leq x \leq 1$, $0 \leq y \leq 1$, $x+y \leq 1$) and may comprise AlN in some embodiments.

In some embodiments the electronic device is formed as a mesa to isolate it from the SAW device. In some embodiments, a trench is formed between the SAW device and the electronic device.

Absorbing and/or reflecting elements may be formed adjacent the interdigital transducers to reduce unwanted reflections that may interfere with the operation of the SAW device.

In some embodiments of the present invention, an electronic device is provided by forming a buffer layer on a substrate, the buffer layer comprising a Group II nitride, such as $Al_xGa_{1-x}N$ ($0 \leq x \leq 1$) or $In_yAl_xGa_{1-x-y}N$ ($0 \leq x \leq 1$, $0 \leq y \leq 1$, $x+y \leq 1$); forming a plurality of epitaxial layers on the buffer layer; exposing a portion of a surface of the buffer layer; forming gate, source and drain contacts on the plurality of epitaxial layers to define a transistor device; and forming interdigital transducers on the exposed portion of the buffer layer to define a SAW device.

A portion of a surface of the buffer layer may be exposed by etching the plurality of epitaxial layers. Alternatively, the buffer layer may be masked and an opening formed in the mask. The plurality of epitaxial layers may be grown through the opening the mask removed.

In some embodiments of the present invention, a trench is formed, for example by etching, between the transistor device and the SAW device to isolate the SAW device. The trench may have a depth greater than or equal to one SAW wavelength, and may extend into the substrate.

Other embodiments of the present invention include masking the plurality of epitaxial layers with an implant mask; implanting ions into the plurality of epitaxial layers to form an implanted region of the epitaxial layers that is semi-insulating; and forming the interdigital transducers on the implanted region.

Particular embodiments of the present invention include forming a buffer layer on the substrate, the buffer layer comprising a Group III nitride, such as $Al_xGa_{1-x}N$ ($0 \leq x \leq 1$) or $In_yAl_xGa_{1-x-y}N$ ($0 \leq x \leq 1$, $0 \leq y \leq 1$, $x+y \leq 1$); forming a channel layer on the buffer layer; forming a barrier layer on the channel layer; forming an etch mask on the barrier layer; etching a portion of the barrier layer to expose a portion of the channel layer; removing the etch mask; forming gate, source and drain contacts on the barrier layers to define a transistor device; and forming interdigital transducers on the exposed portion of the channel layer to define a SAW device.

Other embodiments of the present invention include forming an epitaxial layer of silicon carbide on the substrate; masking the silicon carbide epitaxial layer with an etch mask; etching a portion of the silicon carbide epitaxial layer to expose a portion of the substrate; masking the silicon carbide epitaxial layer with a growth mask; growing a layer of a Group III nitride, such as $Al_xGa_{1-x}N$ ($0 \leq x \leq 1$) or $In_yAl_xGa_{1-x-y}N$ ($0 \leq x \leq 1$, $0 \leq y \leq 1$, $x+y \leq 1$), on the exposed substrate; forming gate, source and drain contacts on the silicon carbide epitaxial layer to define a transistor device; and forming interdigital transducers on the Group III nitride layer to define a SAW device.

In some embodiments, the growth mask extends across the exposed substrate for a predetermined distance so that the Group III nitride layer is spaced apart from the silicon carbide epitaxial layer.

DETAILED DESCRIPTION

The present invention now will be described more fully hereinafter with reference to the accompanying drawings, in which various embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. Accordingly, the present invention is not limited to the relative size and spacing illustrated in the accompanying figures. As will also be appreciated by those of skill in the art, references herein to a layer formed "on" a substrate or other layer may refer to the layer formed directly on the substrate or other layer or on an intervening layer or layers formed on the substrate or other layer. Moreover, it will be understood that when a first element or layer is described as "in electrical contact" with a second element or layer, the first and second elements or layers need not be in direct physical contact with one another, but may be connected by intervening conductive elements or layers which permit current flow between the first and second elements or layers.

Figure 1A:
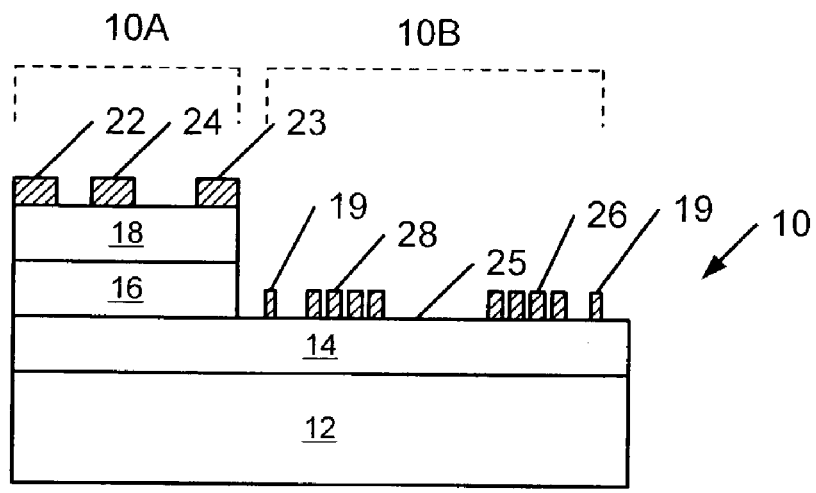
FIGS. 1A–1C are schematic drawings illustrating embodiments of the present invention along with device precursors that may be an intermediate step in the fabrication of a device as illustrated.

Embodiments of the present invention are schematically illustrated as an integrated SAW device/transistor 10 in the cross-sectional view of FIG. 1A. In the embodiment illustrated in FIG. 1A, a transistor structure 10A of a device 10 comprises a high electron mobility transistor (HEMT); however, it will be appreciated by those skilled in the art that the transistor structure 10A (as well as the transistor structures illustrated in connection with other embodiments of the invention described below) may comprise one or more other types of devices instead of or in addition to a HEMT. For example, the transistor structure 10A may comprise a MESFET, MOSFET, JFET or other device.

The integrated device 10 includes a substrate 12 that may, for example, be silicon carbide (SiC), such as semi-insulating silicon carbide of the 4H polytype. Other silicon carbide candidate polytypes include the 3C, 6H, and 15R polytypes. The term "semi-insulating" is used descriptively rather than in an absolute sense. In particular embodiments of the present invention, the silicon carbide bulk crystal has a resistivity equal to or higher than about $1 \times 10^5$ Ω-cm at room temperature.

An aluminum nitride buffer layer 14 on the substrate 12 provides an appropriate crystal structure transition between the silicon carbide substrate and the remainder of the device. In the embodiments illustrated in FIG. 1A, the aluminum nitride buffer layer 14 also forms a piezoelectric film on which a SAW device 10B is fabricated as described in more detail below. The buffer layer 14 and subsequent GaN-based layers may be formed by MOCVD, MBE, or any other suitable growth technique for forming high-quality epitaxial layers.

Silicon carbide has a much closer crystal lattice match to Group III nitrides than does sapphire ($Al_2O_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance.

Although silicon carbide is the preferred substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ or $In_yAl_xGa_{1-x-y}N$ where $0 \leq x \leq 1$, $0 \leq y \leq 1$ and $x+y \leq 1$ are often used to describe them.

Appropriate semi-insulating SiC substrates are manufactured by, for example, Cree, Inc., of Durham, N.C., the assignee of the present invention, and the methods for producing are described, for example, U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,592,501, the contents of which are also incorporated herein by reference in the entirety.

Suitable structures for GaN-based HEMTs are described, for example, in commonly assigned U.S. Pat. No. 6,316,793 and U.S. application Ser. No. 09/904,333 filed Jul. 12, 2001 for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. provisional application Ser. No. 60/290,195 filed May 11, 2001 for "GROUP III NITRIDE BASED HIGH ELECTRON MOBILITY TRANSISTOR (HEMT) WITH BARRIER/SPACER LAYER" and U.S. patent application Ser. No. 10/102,272, to Smorchkova et al., entitled "GROUP-III NITRIDE BASED HIGH ELECTRON MOBILITY TRANSISTOR (HEMT) WITH BARRIER/SPACER LAYER" the disclosures of which are hereby incorporated by reference.

Continuing with the description of FIG. 1A, a channel layer 16, which in some embodiments is GaN, is formed on the buffer layer 14. The channel layer 16 is preferably undoped, but may be doped with various substances in order to modify the electron concentration in the sheet charge region or the behavior of the conduction band $E_c$ and valence band $E_v$ in the area below the sheet charge region. In some embodiments, the channel layer 16 is about 1 to 5 μm thick. In some embodiments, the channel layer 16 may comprise a thick (1 to 5 μm) GaN-based buffer layer with a thin (approximately 100 Å) high-quality channel region formed thereon.

The barrier layer 18 is formed on the channel layer 16. In some embodiments, the barrier layer 18 may comprise AlGaN, thereby forming a heterojunction between the channel layer 16 and the barrier layer 18. The barrier layer 18 preferably has an aluminum composition of between 20% and 40% and may be doped with silicon at a doping concentration of about $2 \times 10^{18}$ cm$^{-3}$. The barrier layer 18 may be between about 15 nm and 40 nm in thickness, and is preferably about 25 nm thick.

As described above, because of the AlGaN/GaN heterobarrier at the interface between the channel layer 16 and the barrier layer 18, a two dimensional electron gas is induced at the interface. An ohmic source electrode 22 and an ohmic drain electrode 23 are formed on the surface of the barrier layer 18. The source 22 and drain 23 ohmic electrodes may be Ti/Si/Ni, Ti/Al/Ni, Ti/Al/Ni/Au or any other suitable material that forms an ohmic contact to n-type AlGaN. Appropriate ohmic contacts for AlGaN/GaN HEMT devices are described in S. T. Sheppard, W. L. Pribble, D. T. Emerson, Z. Ring, R. P. Smith, S. T. Allen and J. W. Palmour, "High Power Demonstration at 10 GHz with GaN/AlGaN HEMT Hybrid Amplifiers," Presented at the 58th Device Research Conference, Denver, Colo. June 2000, and S. T. Sheppard, K. Doverspike, M. Leonard, W. L. Pribble, S. T. Allen and J. W. Palmour, "Improved 10-GHz Operation of GaN/AlGaN HEMTs on Silicon Carbide," Mat. Sci. Forum, Vols. 338–342 (2000), pp. 1643–1646.

The distance between the source electrode 22 and the drain electrode 23 is typically about 2–4 μm.

In some embodiments, a thin (20–40 Å), undoped GaN cap layer (not shown) may be formed on the surface of the barrier layer 18 between the source 22 and the drain 23 ohmic electrodes. The design and effect of such cap layers is described in detail in U.S. application Ser. No. 09/904,333 to Smith for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME" the disclosure of which is hereby incorporated by reference.

The gate electrode 24 is formed between the source 22 and the drain 23 electrodes. In certain embodiments, the gate electrode 24 is formed of platinum, nickel or any other suitable metal that forms a non-ohmic contact to n-type $Al_xGa_{1-x}N$. The gate electrode 24 may be capped with an additional metal layer in a T-gate configuration, or a T-gate may be formed in one process step. As is known in the art, T-gate configurations are particularly suitable for RF and microwave devices.

The barrier layer 18 may also be provided with multiple layers as described in the above-referenced U.S. patent application Ser. No. 10/102,272, to Smorchkova et al. Thus, embodiments of the present invention should not be construed as limiting the barrier layer to a single layer but may include, for example, barrier layers having combinations of GaN, AlGaN and/or AlN layers. For example, a GaN, AlN structure may be utilized to reduce or prevent alloy scattering.

As illustrated in FIG. 1A, a portion of the surface 25 of the buffer layer 14, such as an AlN buffer layer, is exposed. A first plurality of metal fingers 26 forms an input IDT on the exposed surface 25, while a second plurality of metal fingers 28 forms an output IDT. The input IDT 26, the output IDT 28 and the AlN buffer layer 14 form a surface acoustic wave device 10B integrated on the same substrate as the transistor 10A. The IDTs 26, 28 may be formed of aluminum or any other suitable metal. Since the IDTs 26, 28 do not have to form an ohmic or other electrical contact with the buffer layer 14, many different metals may be employed (including for example the same metals used for the gate 24, the source 22 and drain 23 ohmic contacts and/or metal interconnections to reduce the number of metallization steps required).

The thickness of the buffer layer 14 affects the SAW propagation characteristics of SAW structure 10B. In general, a surface acoustic wave propagating in a device extends for a distance of about one wavelength into the structure. In some embodiments, the buffer layer is about 250 nm or less. In that case, the SAW velocity of the propagating wave may be dominated by the SiC substrate, which has a higher SAW velocity than AlN. Also, the orientation of the SAW IDT fingers 26, 28 may be chosen so as to optimize the performance of the device. Although it has been reported that SAW propagation is isotropic in the c-plane of AlN and SiC, it is possible to fabricate devices using off-axis cut SiC substrates, which may make the propagation of surface acoustic waves dependent on orientation. For example, SiC MESFETs are typically manufactured using 8° off-axis wafers.

The input IDT 26 or the output IDT 28 may be connected to the source 22, the drain 23 and/or the gate 24 of transistor 10A via an overlayer metal (not shown), or via wire bonding or any other suitable technique so that electrical signals can be communicated from transistor 10A to SAW device 10B and vice versa.

Figure 9:
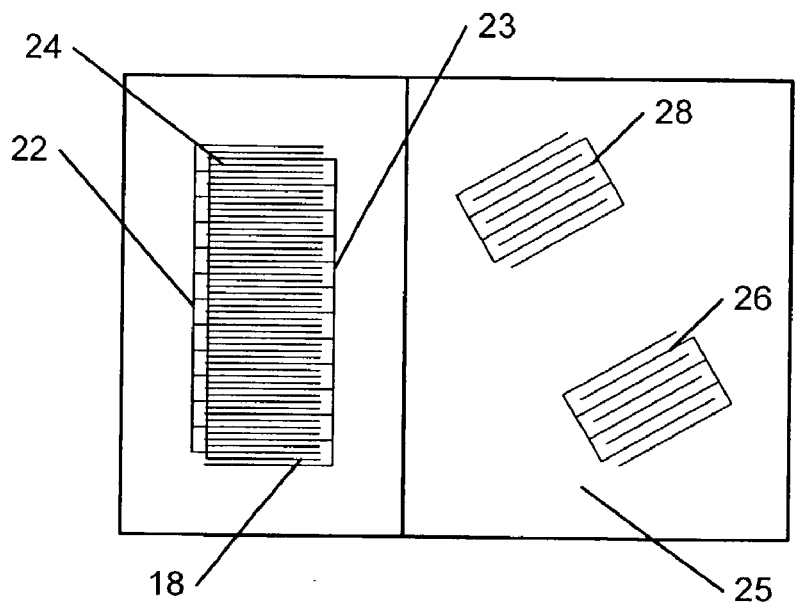
FIG. 9 is a schematic drawing illustrating embodiments of the present invention.
Figure 10:
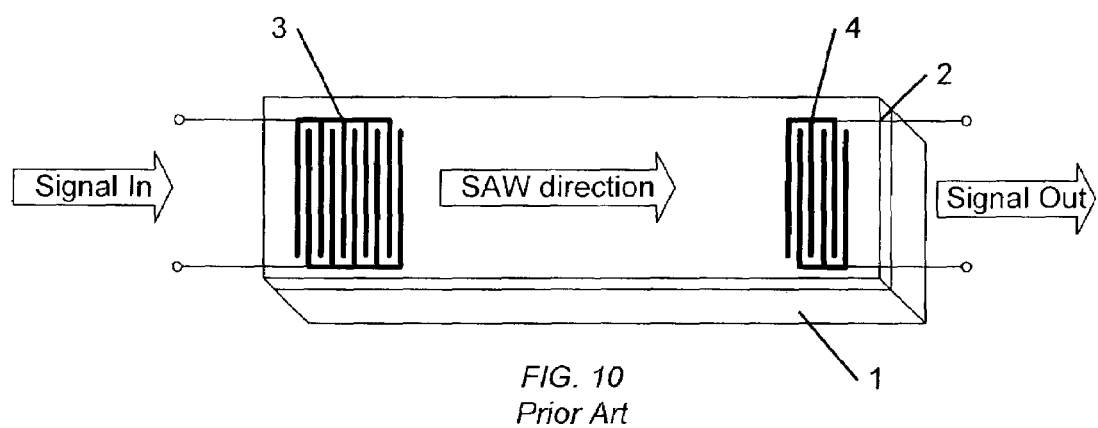
FIG. 10 is a perspective drawing illustrating a conventional surface acoustic wave device.
Figure 11:
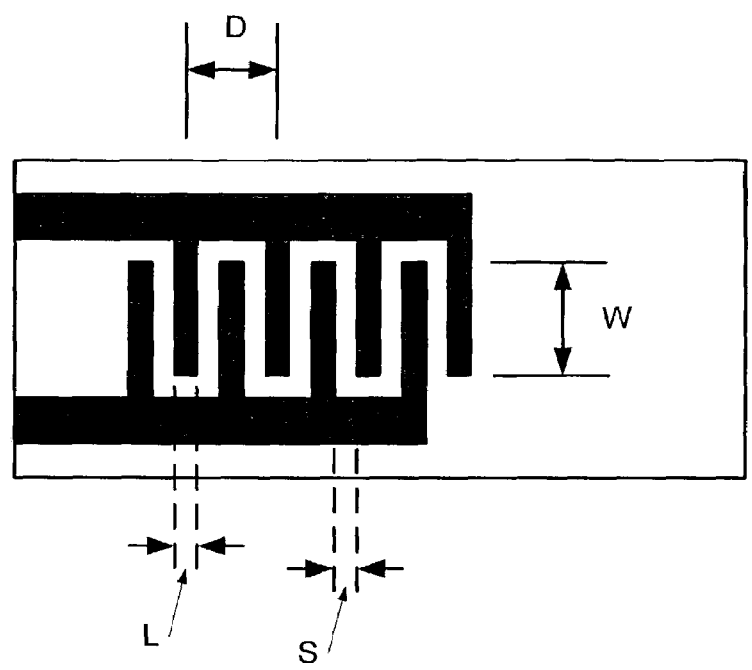
FIG. 11 is a schematic drawing illustrating the layout of an interdigital transducer of a conventional surface acoustic wave device.

To reduce and/or minimize undesired reflections and interference from the transistor 10A, the die may be cut at an angle different from the orientation of the IDT fingers 26, 28 as illustrated in FIG. 9. In addition, SAW reflectors and/or absorbers 19 may be formed on the device adjacent the input IDT 26 and/or the output IDT 28 to minimize undesired interference. The design of SAW reflectors and absorbers is well known to those skilled in the design of SAW devices.

Figure 1B:
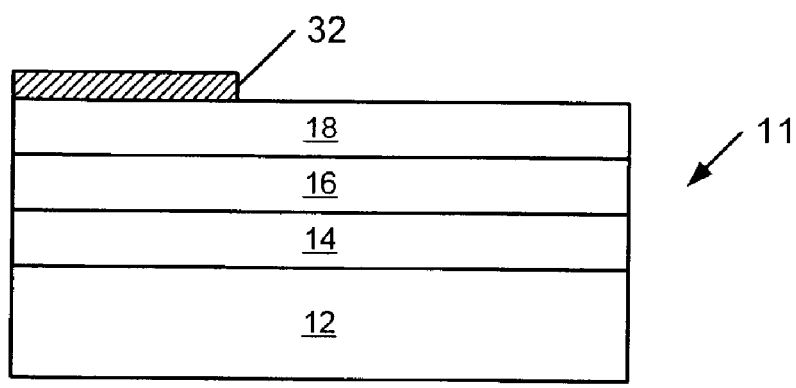
Figure 1C:
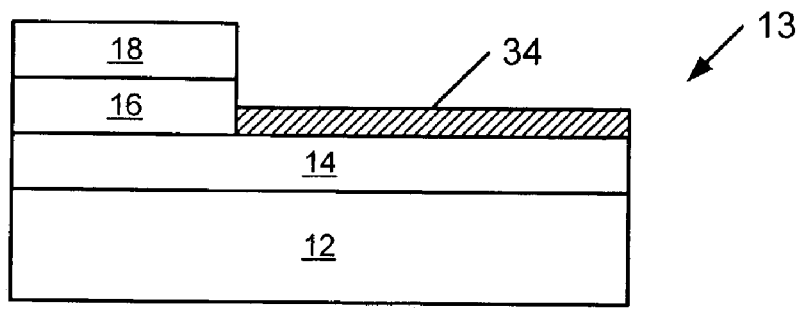

Precursor structures illustrating alternative methods of fabricating the device 10 are illustrated in FIGS. 1B and 1C. As illustrated in FIG. 1B, a precursor device 11 may be formed by depositing epitaxial layers on a substrate 12 to form the buffer layer 14, the channel layer 16 and the barrier layer 18. Prior to metallization, an etch mask 32 is formed on the surface of the barrier layer 18. The etch mask 32 may comprise photoresist, silicon dioxide, silicon nitride, or any other suitable mask that permits selective etching of the underlying nitride epitaxial layers. The etch mask 32 is patterned using standard photolithography techniques and partially removed. A typical photolithography process can include the steps of adding a layer of photoresist (typically a polymer resin sensitive to light) to a semiconductor structure, positioning a mask over the photoresist, exposing the photoresist to a frequency of light to which it responds (by undergoing a chemical change; usually its solubility in a particular solvent), etching the photoresist to remove the exposed or unexposed pattern (depending upon the resist selected), and then carrying out the next desired step on the remaining pattern.

The barrier and channel layers 16, 18 are then etched away to reveal a portion of the AlN buffer layer 14 on which the IDTs 26, 28 may be formed. The etch mask 32 is then removed and metallization steps are performed to form the contacts 22, 23, 24 and the IDTs 26, 28.

The barrier 16 and the channel 18 layers may be etched using a dry etch process such as reactive ion etching (RIE). Suitable conditions for dry etching the mesa may include dry etching in an Ar environment using $BCl_3$ etchant. For example, a typical process may include flowing Ar at 20–100 sccm and $BCl_3$ at 10–20 sccm in an RIE reactor at a pressure of 5–50 mTorr and an RF power at 50–300 W. Actual parameters will depend on the system used and may be determined by those skilled in the art.

An alternative method of fabricating device 10 may be understood with reference to the precursor structure 13 shown in FIG. 1C. The device 10 may be fabricated by placing the substrate 12 into a growth reactor and depositing the AlN buffer layer 14 on the substrate 12 as described above. After formation of the buffer layer 14, the substrate 12 is removed from the growth reactor and a growth mask 34 (which may comprise silicon dioxide, silicon nitride or another suitable material) is formed on the surface of the buffer layer. The mask layer 34 is patterned using standard photolithographic techniques as described above to reveal a portion of the surface of the buffer layer 14. After formation and patterning of the mask layer 34, the substrate 12 is placed back into a growth reactor for the regrowth of channel and the barrier layer 16 and the channel layer 18 (and any other layers that may be present in the device). The contacts 22, 23, 24 and the IDTs 26, 28 may then be formed on the structure after removal of the mask layer 34.

Figure 2A:
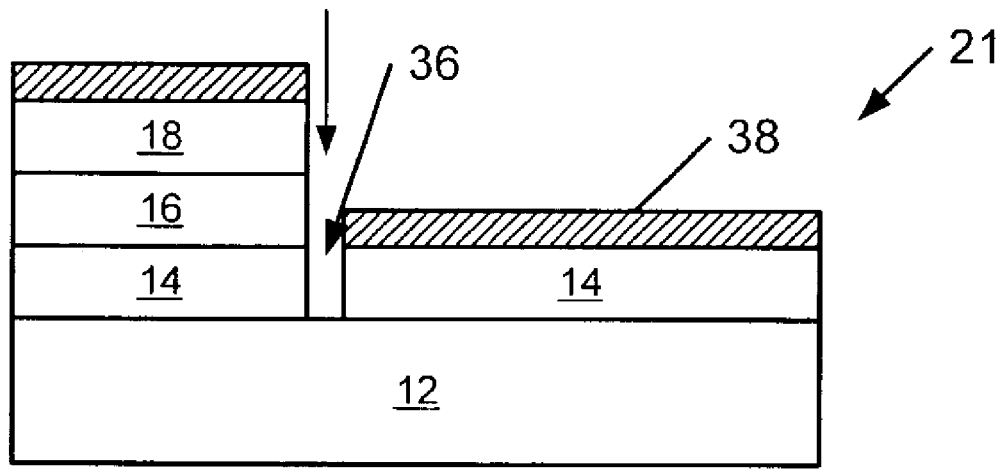
FIGS. 2A–2B are schematic drawings illustrating embodiments of the present invention along with a device precursor that may be an intermediate step in the fabrication of a device as illustrated.
Figure 2B:
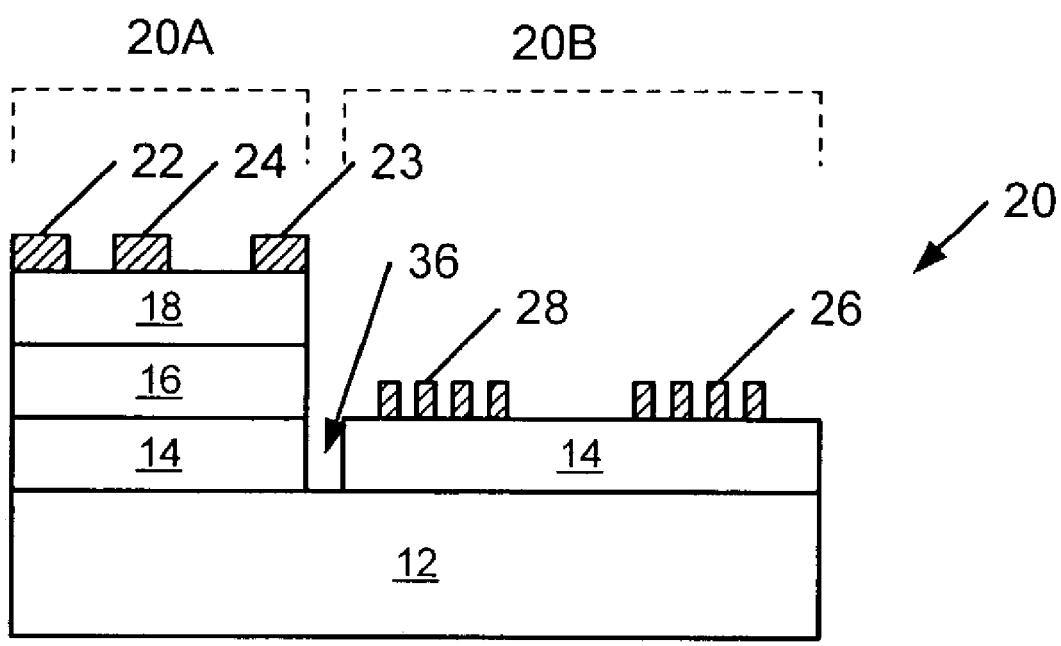

As illustrated in FIGS. 2A and 2B, the device 20 includes a SAW structure 20B that is isolated from a transistor structure 20A by forming a trench 36 between the structures that extends through buffer layer 14. The trench 36 may extend into the substrate 12 depending on the thickness of the buffer layer 14 and the wavelength of the device. As discussed above, a SAW extends for a distance of about one wavelength into the propagating medium. Thus, the trench 36 may extend for a distance of at least about one wavelength in order to provide physical isolation of SAW device 20B.

As illustrated in FIG. 2A, the trench 36 may be formed before, during or after formation of the transistor. For example, an etch mask 38 may be formed on the structure and patterned to reveal a portion of the buffer layer 14 adjacent the transistor mesa. The exposed region is then etched in the manner described above to provide device isolation. After etching, the etch mask is removed and metallization is performed as illustrated in FIG. 2B.

Figure 3A:
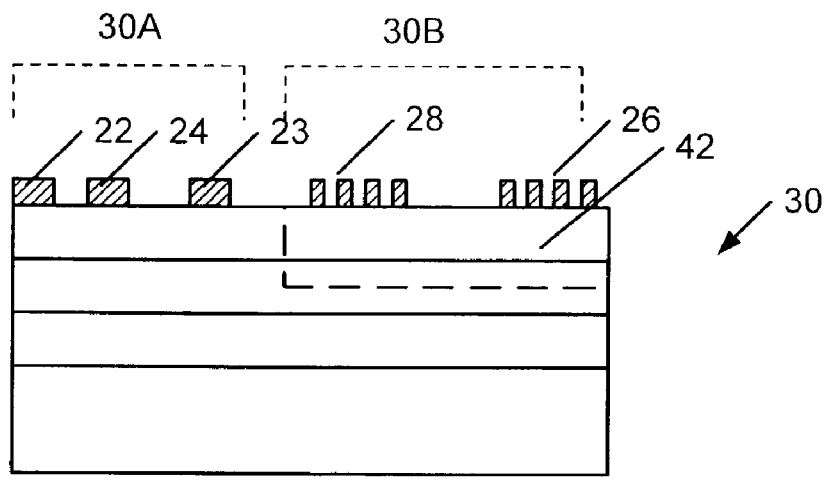
FIGS. 3A–3B are schematic drawings illustrating embodiments of the present invention along with a device precursor that may be an intermediate step in the fabrication of a device as illustrated.
Figure 3B:
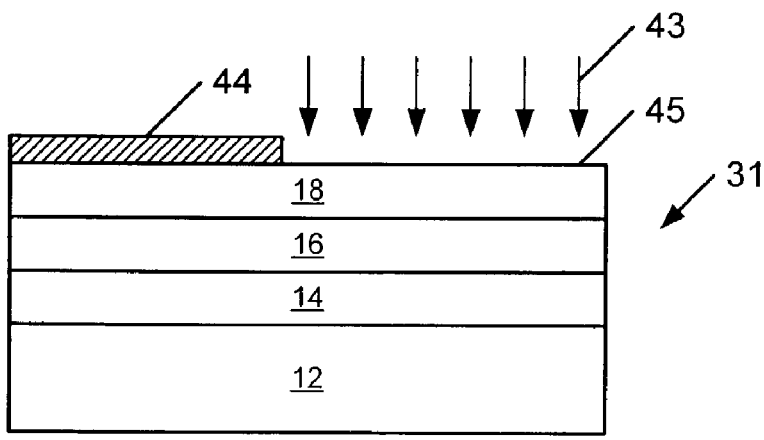

FIGS. 3A–3B illustrate other embodiments of the invention. As FIG. 3A schematically illustrates, a device 30 includes a transistor structure 30A and a SAW device structure 30B formed on a common substrate. However, in this embodiment, the IDTs 26, 28 of the SAW device 30B are formed on the surface of the same epitaxial layer as the transistor electrodes, thus avoiding the need for regrowth or mesa etching.

In order to electrically isolate the SAW device 30B from the transistor structure 30A and reduce loss in the SAW device itself, ions 43, such as nitrogen or phosphorus, are implanted into a region 42 of the device to render the region 42 sufficiently highly resistive as to be electrically inactive.

As illustrated in FIG. 3B, after growth of the epitaxial layers of the transistor structure 30A to form an epitaxial precursor structure 31, a patterned implant mask 44 (which may comprise photoresist) is formed on the surface of the precursor structure 31 and nitrogen ions 43 are implanted into the exposed surface 45 so as to implant the nitrogen ions 43 into the region 42. Other ions can be used to increase the resistivity of the region via implantation, including hydrogen, helium, aluminum and nitrogen.

The implantation can be carried out in a conventional fashion and at room temperature. As presently best understood (and without being limited by a particular theory), the implanting ions create damage within the GaN to produce deep levels within the bandgap. These in turn trap free carriers in the GaN, thus rendering the material more resistive than a GaN layer or region without such an implant. In a HEMT structure, the implanted ions effectively neutralize the conductive 2DEG channel at the interface between the barrier and channel layers.

In certain embodiments, nitrogen atoms are implanted into the exposed region at an energy of 10–400 keV and a dosage of $10^{13}$–$10^{14}$ ions per square centimeter ($cm^{-2}$). Such a dose may be sufficient to neutralize the region 42 or otherwise make the region 42 sufficiently non-conductive such that the transistor structure 30A is electrically isolated from the SAW device 30B such that the electrical performance of either the transistor structure 30A or the SAW device 30B are not substantially impaired by the other device.

Figure 4:
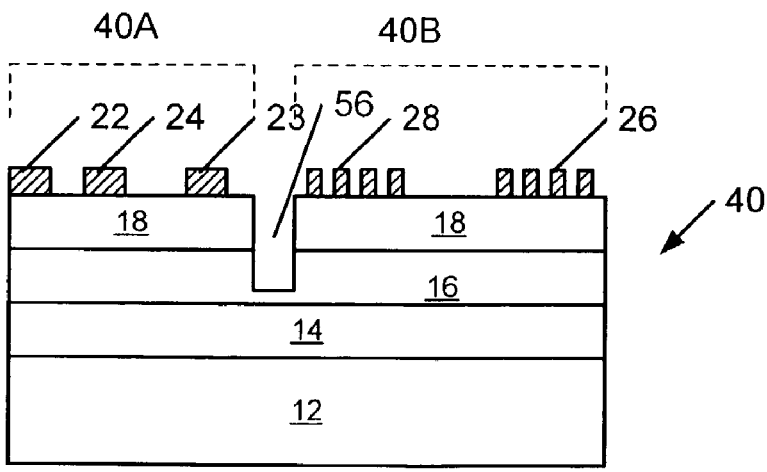
FIG. 4 is a schematic drawing illustrating embodiments of the present invention.

FIG. 4 illustrates a device 40 according to further embodiments of the present invention. As with the embodiments described in connection with FIGS. 3 and 3A, a SAW device 40B is formed on the same epitaxial surface as the transistor structure 40A. However, in addition to the implant neutralization of the layers forming the SAW device 40B, an isolation trench 56 is formed between the SAW structure 40B and the transistor structure 40A using the masking and etching techniques described above in connection with FIGS. 2A and 2B. As discussed above, the depth of the trench 56 may be equal to at least one SAW wavelength.

Figure 5:
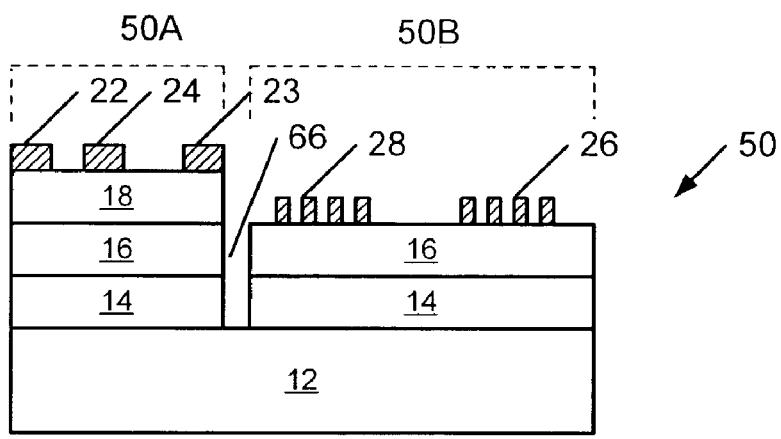
FIG. 5 is a schematic drawing illustrating embodiments of the present invention.

Further embodiments of the present invention are illustrated in FIG. 5. In the embodiments illustrated in FIG. 5, the barrier and the channel layers of the transistor structure 50A are etched down into the thick GaN layer 16 to remove the 2DEG region between the barrier and channel layers. The SAW IDTs are formed on the exposed surface of the GaN layer, which is semi-insulating as grown. An optional isolation trench 66 may be etched between the transistor structure 50A and the SAW device structure 50B using the techniques described above.

Figure 6A:
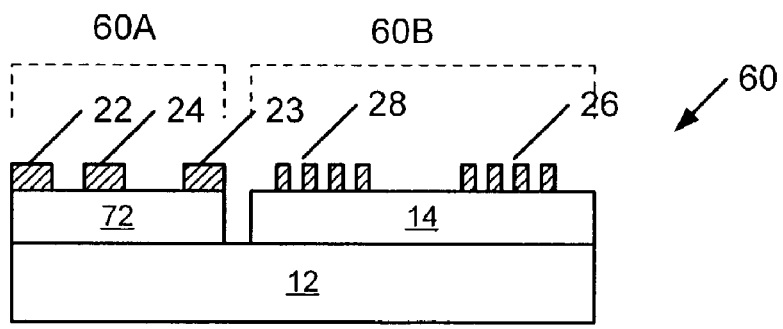
FIGS. 6A–6C are schematic drawings illustrating embodiments of the present invention along with a device precursor that may be an intermediate step in the fabrication of a device as illustrated.
Figure 6B:
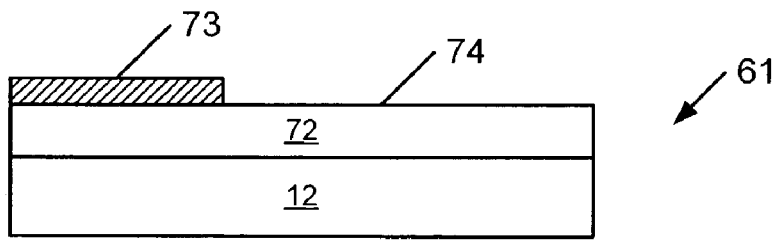
Figure 6C:
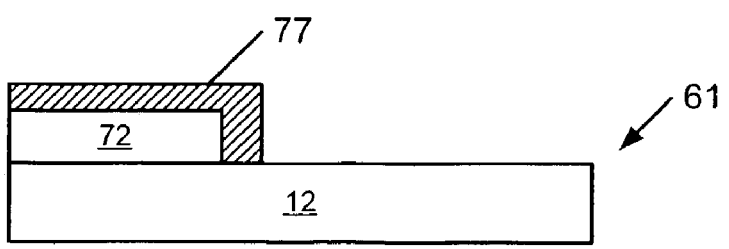

In the embodiments illustrated in FIGS. 6A–6C, an AlN-based SAW structure 60B is integrated on the same substrate as a SiC MESFET structure 60A. Techniques for growing epitaxial layers of silicon carbide are disclosed in U.S. Pat. Nos. 6,063,186; 6,297,522; 6,217,662; 5,155,062; 4,946,547; 4,912,063; 4,912,064; and 5,011,549, the disclosures of which are incorporated herein by reference. Techniques for growing epitaxial layers of silicon carbide are also disclosed in U.S. application Ser. No. 09/715,576 filed Nov. 17, 2000 for "SUSCEPTOR DESIGNS FOR SILICON CARBIDE THIN FILMS"; U.S. application Ser. No. 09/790,169 filed Feb. 21, 2001 for "SUSCEPTOR DESIGNS FOR SILICON CARBIDE THIN FILMS"; U.S. Publication No. 2001/0170491 published Nov. 21, 2002 for "SEED CRYSTAL HOLDERS AND SEED CRYSTALS FOR FABRICATING SILICON CARBIDE CRYSTALS AND METHODS OF FABRICATING SILICON CARBIDE CRYSTALS"; U.S. Publication No. 2002/0090454 published Jul. 11, 2002 for "GAS-DRIVEN ROTATION APPARATUS AND METHOD FOR FORMING SILICON CARBIDE LAYERS"; U.S. application Ser. No. 10/017,492 filed Oct. 30, 2001 for "INDUCTION HEATING DEVICES AND METHODS FOR CONTROLLABLY HEATING AN ARTICLE"; and U.S. application Ser. No. 10/117,858 filed Apr. 8, 2002 for "GAS-DRIVEN PLANETARY ROTATION APPARATUS AND METHODS FOR FORMING SILICON CARBIDE LAYERS" the disclosures of which are incorporated herein by reference.

The SiC epitaxial layers 72 may be grown using techniques described in the foregoing patents and applications to form a precursor structure 61 as illustrated in FIG. 6B. An etch mask 73 is formed on the surface of the SiC epitaxial layers 72 and patterned to reveal a portion of the surface 74 of the SiC epitaxial layers 72. The precursor structure 61 is then etched to reveal a portion of the semi-insulating SiC substrate. The remaining SiC epitaxial layers are then masked with a growth mask 77 illustrated in FIG. 6C that extends just past the edge of the SiC epitaxial layers 72 by a predetermined distance that may depend on the thickness of the growth mask 77. The etch mask 73 may or may not be removed prior to formation of the growth mask 77.

A layer of crystalline AlN 14 is regrown on the exposed substrate and the mask 77 is removed. Because the regrown AlN layer 14 is separated from the SiC epitaxial layer 72, the SAW structure 60B and the MESFET structure 60A are isolated as grown. The metal contacts 22, 23, 24 are formed on the SiC epitaxial layers 72 and the SAW IDTs 26, 28 are then formed on the AlN layer to complete the device.

Figure 7:
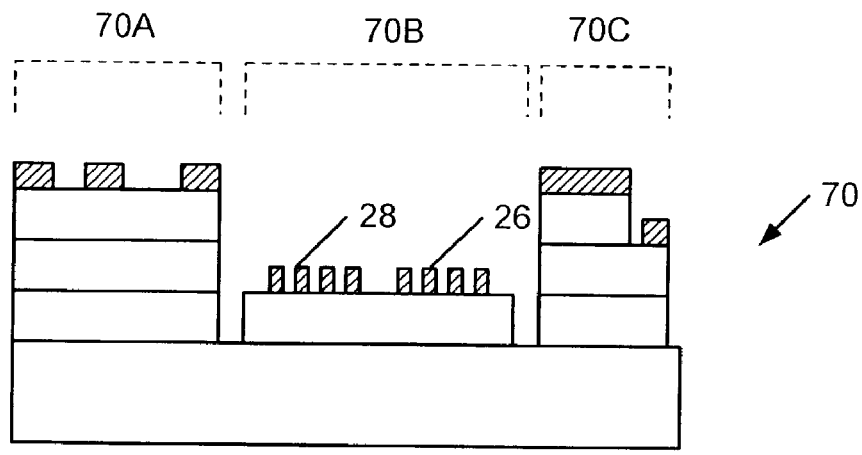
FIG. 7 is a schematic drawing illustrating embodiments of the present invention.
Figure 8:
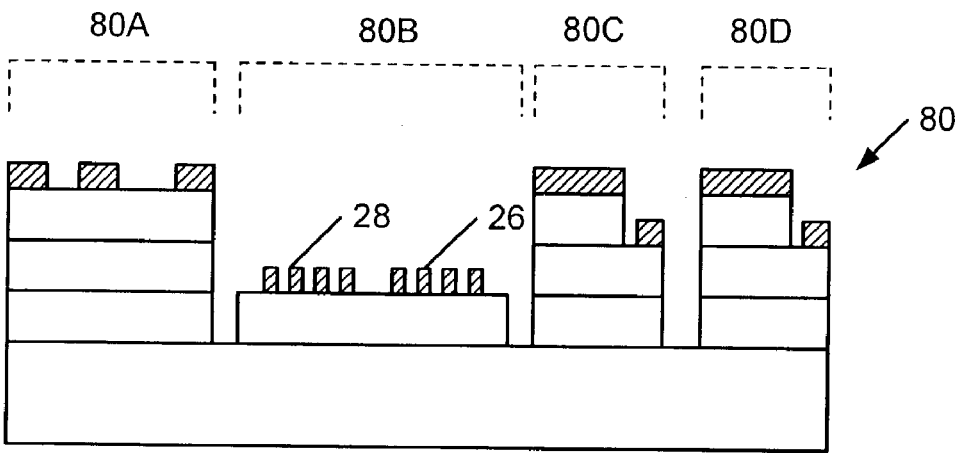
FIG. 8 is a schematic drawing illustrating embodiments of the present invention.

As illustrated in FIG. 7, the foregoing techniques can be extended to integrate more than one type of device on the same substrate as one or more SAW devices. For example, the device 70 includes a transistor structure 70A, a SAW device 70B and a photodetector structure 70C integrated on the same substrate 12. Such a device may, for example, be used as a monolithic element capable of receiving, amplifying, and filtering an optical information signal. Likewise, the embodiments illustrated in FIG. 8 include a transistor structure 80A, a SAW device 80B, a photodetector structure 80C, and an emitter structure 80D integrated on the same substrate 12. Such devices may, for example, be used as a monolithic element capable of receiving, amplifying, and filtering an optical information signal and transmitting an information signal. The design of GaN-based emitters and photodetectors is well known to those skilled in the art. Examples of GaN-based photodetectors are illustrated in U.S. Pat. Nos. 6,495,852 and 6,265,727, which are incorporated herein by reference. Examples of GaN-based emitters are illustrated in U.S. Pat. Nos. 5,523,589 and 5,739,554, which are incorporated herein by reference.

Other circuit elements may be integrated onto the same substrate as the SAW device and the electronic device. For example, capacitors, inductors, resistors, delay lines and the like may be integrated into the device as well.

While embodiments of the present invention have been described with reference to isolation of the SAW device(s) from other devices on a common substrate through the use of etching and/or selective growth processes, other techniques of trench formation such as sawing, laser ablation or other techniques known to those of skill in the art may be utilized to provide such isolation trenches. Furthermore, embodiments of the present invention should not be construed as limited to the particular techniques described herein for providing an isolated piezoelectric layer on a common substrate. For example, lift-off or other techniques could be utilized to provide the piezoelectric layer for a SAW device that is integrated with other devices on a common substrate.

Embodiments of the invention have been set forth in the drawings and specification, and although specific terms have been employed, they are used in a generic and descriptive sense only and not for purposes of limitation, the scope of the invention being defined in the claims.

That which is claimed is:

1. A monolithic electronic device, comprising:
   a substrate;
   a piezoelectric Group III-nitride epitaxial layer formed on the substrate;
   a plurality of metal fingers formed on a semi-insulating region of the Group III-nitride epitaxial layer,
   the plurality of metal fingers and the semi-insulating region together forming a surface acoustic wave device, the plurality of metal fingers forming an input transducer and an output transducer;
   at least one electronic device formed on the substrate, the at least one electronic device comprising a metal contact;
   a trench between the surface acoustic wave device and the at least one electronic device; and
   wherein the metal contact is electrically connected to at least one of the input and/or the output transducers.

2. A monolithic electronic device as recited in claim 1, wherein the at least one electronic device comprises a transistor.

3. A monolithic electronic device as recited in claim 1, wherein the at least one electronic device comprises a photodiode.

4. A monolithic electronic device as recited in claim 1, wherein the at least one electronic device comprises a light emitting diode.

5. A monolithic electronic device as recited in claim 1, wherein the piezoelectric epitaxial layer comprises $Al_xGa_{1-x}N$ ($0 \leq x \leq 1$).

6. A monolithic electronic device as recited in claim 5, wherein the piezoelectric epitaxial layer comprises single crystal AlN.

7. A monolithic electronic device as recited in claim 6, wherein the piezoelectric epitaxial layer comprising AlN is formed directly on the substrate.

8. A monolithic electronic device as recited in claim 7, wherein the thickness of the piezoelectric epitaxial layer comprising AlN is less than one SAW wavelength.

9. A monolithic electronic device as recited in claim 7, wherein the thickness of the piezoelectric epitaxial layer comprising AlN is greater than or equal to one SAW wavelength.

10. A monolithic electronic device as recited in claim 1, wherein the piezoelectric epitaxial layer comprises $In_yAl_xGa_{1-x-y}N$ ($0 \leq x \leq 1$, $0 \leq y \leq 1$, $x+y \leq 1$).

11. A monolithic electronic device as recited in claim 1, wherein the at least one electronic device is formed on a mesa adjacent the surface acoustic wave device.

12. A monolithic electronic device as recited in claim 1, wherein the plurality of metal fingers comprise aluminum.

13. A monolithic electronic device as recited in claim 1, wherein the trench extends through the piezoelectric epitaxial layer into the substrate.

14. A monolithic electronic device as recited in claim 1, wherein the at least one electronic device comprises a silicon carbide MESFET.

15. A monolithic electronic device as recited in claim 1, wherein the plurality of metal fingers are oriented at an angle with respect to an edge of the monolithic electronic device die.

16. A monolithic electronic device as recited in claim 1, further comprising a SAW absorber adjacent at least one of the input and/or output transducers.

17. A monolithic electronic device as recited in claim 1, further comprising a SAW reflector adjacent at least one of the input and/or output transducers.

18. A monolithic electronic device as recited in claim 1, wherein the metal fingers are formed above an implanted, electrically inactive region.

19. A monolithic electronic device as recited in claim 1, wherein the substrate comprises SiC.

20. A monolithic electronic device as recited in claim 1, wherein the substrate is selected from the group consisting of sapphire, aluminum nitride, aluminum gallium nitride, gallium nitride, silicon, GaAs, LGO, ZnO, LAO, and InP.

21. A monolithic electronic device, comprising:
   a substrate;
   a Group III-nitride epitaxial layer formed on the substrate;
   a plurality of interdigital transducers (IDTs) formed on a semi-insulating region of the Group III-nitride epitaxial layer, the plurality of IDTs and the semi-insulating region together forming a surface acoustic wave device;
   a trench between the surface acoustic wave device and the at least one electronic device; and
   at least one electronic device formed on the substrate.

22. A monolithic electronic device, comprising:
   a substrate;
   a Group III-nitride epitaxial layer formed on the substrate;
   a surface acoustic wave device formed on a semi-insulating region of the Group III-nitride epitaxial layer;
   at least one electronic device formed on the substrate; and
   a trench between the surface acoustic wave device and the at least one electronic device.

23. A monolithic electronic device, comprising:

a substrate;

a piezoelectric Group III-nitride epitaxial layer formed on the substrate, the piezoelectric Group III-nitride epitaxial layer having a semi-insulating region;

a plurality of metal fingers formed on a semi-insulating region of the Group III-nitride epitaxial layer, the plurality of metal fingers and the semi-insulating region together forming a surface acoustic wave device, the plurality of metal fingers forming an input transducer and an output transducer;

at least one electronic device formed on the substrate, the at least one electronic device comprising a metal contact; and wherein the metal contact is electrically connected to at least one of the input and/or the output transducers and wherein the metal fingers and the metal contact are formed on a same surface of the Group III-nitride epitaxial layer.

24. The monolithic electronic device of claim 23, wherein the semi-insulating region comprises a region implanted with dopants.

* * * * *